Jan. 22, 1963 J. G. DILL 3,075,092

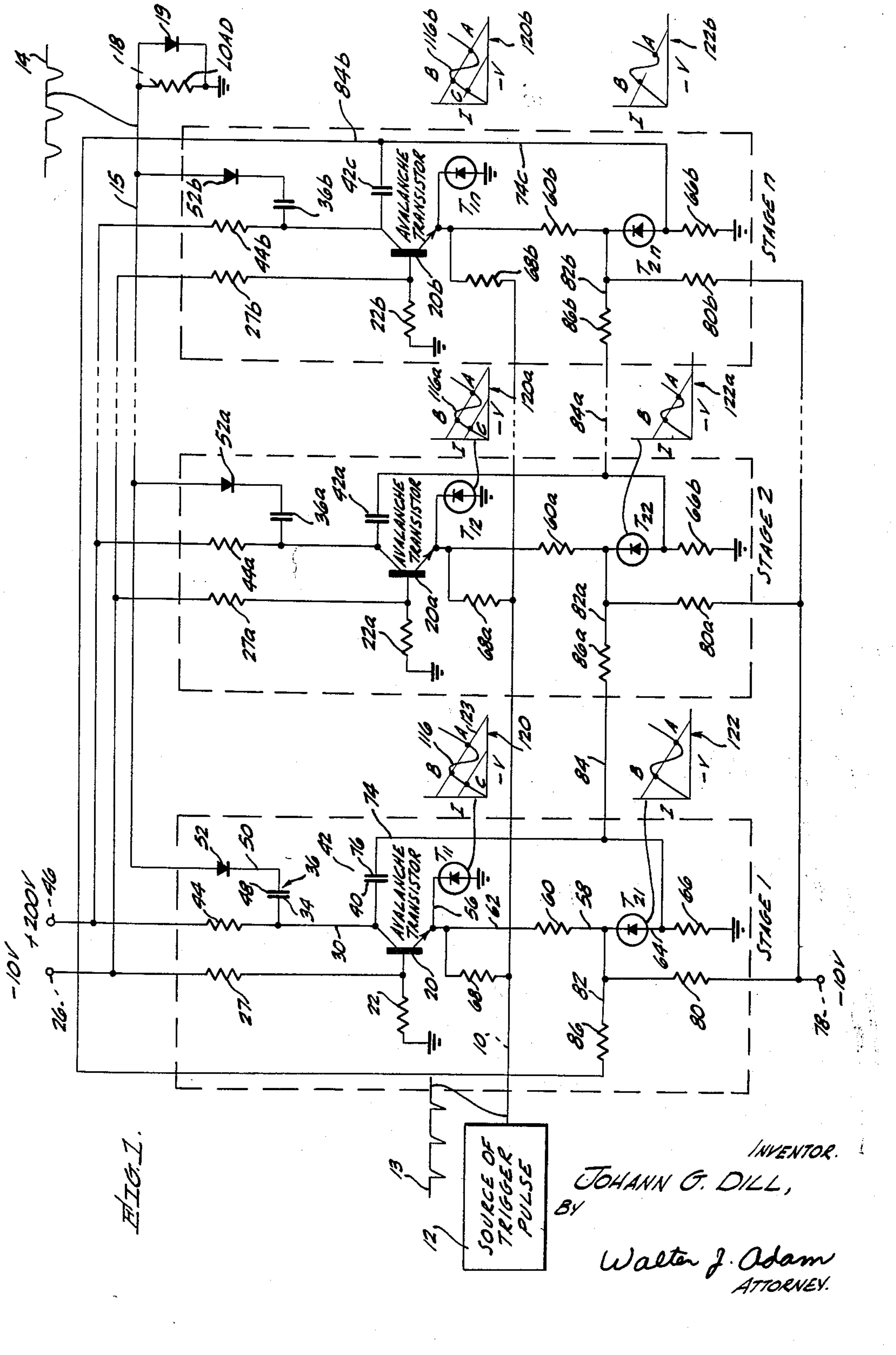
FIG. I.
INVENTOR.
JOHANN G. DILL,
BY
Walter J. Adam
ATTORNEY.

PULSE GENERATING CIRCUIT UTILIZING AVALANCHE TRANSISTORS AND TUNNEL DIODES

Filed Nov. 22, 1960 2 Sheets-Sheet 2

INVENTOR.

JOHANN G. DILL,

BY

Walter J. Adam

ATTORNEY.

3,075,092

PULSE GENERATING CIRCUIT UTILIZING AVALANCHE TRANSISTORS AND TUNNEL DIODES

Johann G. Dill, Costa Mesa, Calif., assignor to Hughes Aircraft Company, Culver City, Calif., a corporation of Delaware Filed Nov. 22, 1960, Ser. No. 70,952
6 Claims. (Cl. 307—88.5)

This invention relates to pulse generators and particularly to a pulse generating circuit utilizing transistors and negative resistance devices to develop high power pulses at a high repetition rate.

Pulse generators utilizing transistors with an avalanche characteristics have the advantage of providing a simplified semiconductor circuit that develops very narrow pulses having a relatively large power capability. A pulse generator circuit utilizing avalanche transistors conventionally requires a storage capacitor coupled in the load current path for limiting the peak current during avalanche multiplication so as to prevent damage to the transistor. In the conventional arrangement, the transistor is biased to an avalanche operating point by a power supply and biasing resistor coupled respectively in series to a point between the capacitor and the load current circuit of the transistor. The capacitor recharges after the formation of each output pulse by current flowing through the biasing resistor from the power supply. However, the pulse repetition rate of the generator is greatly limited by the recovery time provided by the RC time constant of the circuit. Because the operating characteristics of the transistor require that a minimum steady state current be supplied to the transistor and that the potential at the operating point be maintained substantially constant, the valve of the biasing resistor is necessarily relatively large. Thus, the long recovery time required while the storage capacitor is charged through the biasing resistor greatly limits the pulse repetition rate of conventional pulse generator circuits.

It is therefore an object of this invention to provide a high repetition rate pulse generator utilizing semiconductor elements.

It is a further object of this invention to provide a pulse generator utilizing avalanche transistors and operating at a very high repetition rate.

It is a still further object of this invention to provide a high repetition rate pulse generator having a plurality of stages and utilizing tunnel diodes as logical elements so succeeding stages are sequentially energized to allow recovery time for the preceding stages.

It is another object of this invention to provide an improved arrangement for emitter-triggering an avalanche transistor.

Briefly, the circuit in accordance with this invention is a pulse generator including a plurality of sequentially operating pulse generating stages controlled by logical circuitry and connected in parallel through an OR gate to a load. Each stage includes an avalanche transistor having a first electrode coupled both to the OR gate through a storage means and to a source of charging current and having a second electrode coupled to logical circuitry to which trigger pulses are applied. The logical circuitry in each stage includes first and second tunnel diodes coupled to the second electrode of the avalanche transistor, the second tunnel diode providing potential states to maintain the first diode in either a ready low voltage state in a single one of the stages or in a normal low voltage state in the remaining stages. When a trigger pulse is applied to the first tunnel diode of the one stage in which the first tunnel diode is in the ready state, that diode changes to a high voltage state to initiate the transistor into conduction and to develop an output circuit pulse. Load current flowing to the first and second tunnel diodes in that stage then causes the first diode to be set and maintained at the normal low voltage state. The storage means of each stage is coupled to the second diode of each succeeding stage to set, in the succeeding stage, that diode and in turn the first tunnel diode to the ready state only after the preceding stage fires. Thus, each stage is successively fired allowing recovery time for the preceding stages so that load pulses may be developed at a high repetition rate.

The novel features of this invention, as well as the invention itself, both as to its organization and method of operation, will best be understood from the accompanying description, when in connection with the accompanying drawings, in which:

FIG. 1 is a schematic circuit diagram of the pulse generating circuit in accordance with this invention;

Figure 3:
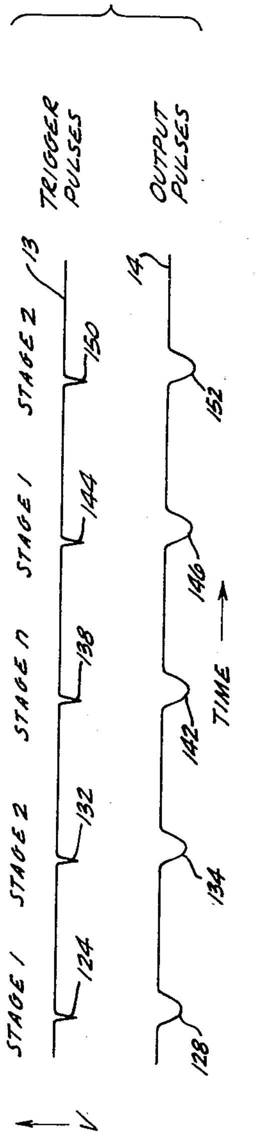
FIG. 3 is a graph of voltage versus time showing waveforms for explaining the sequential operation of the circuit in accordance with this invention.

Referring first to FIG. 1, the pulse generating circuit in accordance with this invention includes a plurality of stages, such as stages 1, 2 and *n*, responsive through a lead 10 to a train of input signal pulses, as shown by a waveform 13, from a trigger pulse source 12 to apply output signal pulses having the characteristic shown by a waveform 14, through a common lead 15 to a common load element as shown as a load resistor 18. A diode 19 is coupled in parallel with the load 18 to suppress positive overshoot voltages of the output signal. Each of the stages 1, 2 and *n* have similar elements so that only the arrangement of the elements of stage 1 will be described in detail.

Stage 1, for example, includes an avalanche transistor 20 of the n-p-n type with the base coupled to ground through a current limiting resistor 22. As will be explained in further detail subsequently, the avalanche transistor 20 has a negative resistance region resulting from the avalanche multiplication properties thereof. For maintaining the transistor 20 normally nonconductive, the negative terminal of a source potential may be connected to terminal 26 to provide a potential with respect to ground in the order of −10 volts. The terminal 26 is coupled through a resistor 27 to the base of the transistor 20. To allow only a finite amount of energy to flow through the transistor 20 when rendered conductive, the collector is coupled through a lead 30 to a first plate 34 of a first storage capacitor 36 and to a first plate 40 of a control capacitor 42. For supplying a source of charging current to the capacitors 36 and 42, and for biasing the transistor 20 in the avalanche region thereof, the lead 30 is coupled through a current limiting resistor 44 to a source of positive potential 46, which may be at +200 volts. A second plate 48 of the capacitor 36 is coupled to a lead 50 and to the anode of a diode 52 having a cathode coupled to the common output lead 15. The diode 52 and diodes 52*a* and 52*b*, which may be conventional diodes, form an OR gate so that only the stage forming a pulse of the waveform 14 conducts current to the load 18. The diodes of the OR gate such as 52 are preferably of a type that develops a small voltage drop in the conductive region.

The logical control circuitry in accordance with this invention coupled to the emitter of the transistor 20, for example, includes a first tunnel diode $T_{11}$ having a cathode coupled through a lead 56 to the emitter of the transistor 20 and an anode coupled to ground. A second tunnel diode $T_{21}$ has a cathode coupled to a lead 58, which in turn is coupled through a resistor 60 to a lead 62 which is coupled to the emitter of the transistor 20. The anode of the diode $T_{21}$ is coupled to a lead 64 which in turn is coupled through a resistor 66 to ground. Trigger pulses of the waveform 13 are applied through the lead 10 and a coupling resistor 68 to the lead 62. For developing a pulse to be applied to the succeeding stage such as stage 2 after a pulse has been formed by the transistor 20 of stage 1, a lead 74 is coupled between a plate 76 of the control capacitor 42 to the lead 64 with the lead 74 coupled to stage 2 by a lead 84. The cathode of the diode $T_{21}$ is biased from a source of negative potential 78, which may be at −10 volts, coupled through a biasing resistor 80 to a lead 82 which in turn is coupled to the lead 58. In order that the stage 1 be set for the ready state by the preceding stage, the lead 82 is coupled through an isolating resistor 86 to a lead **84*b*, which in turn is coupled to the lead 74*c*** of stage *n*.

Other stages in accordance with this invention, such as stage 2 and stage *n* which are similar to stage 1, are indicated by similar numbers with the addition of *a* and *b*, and will not be explained in further detail. It is to be noted that, although only three stages are shown for convenience of illustration, a greater number may be utilized such as at the dotted position of the leads such as 10 between stages 2 and *n*, in order to provide a desired pulse repetition frequency.

Figure 2:
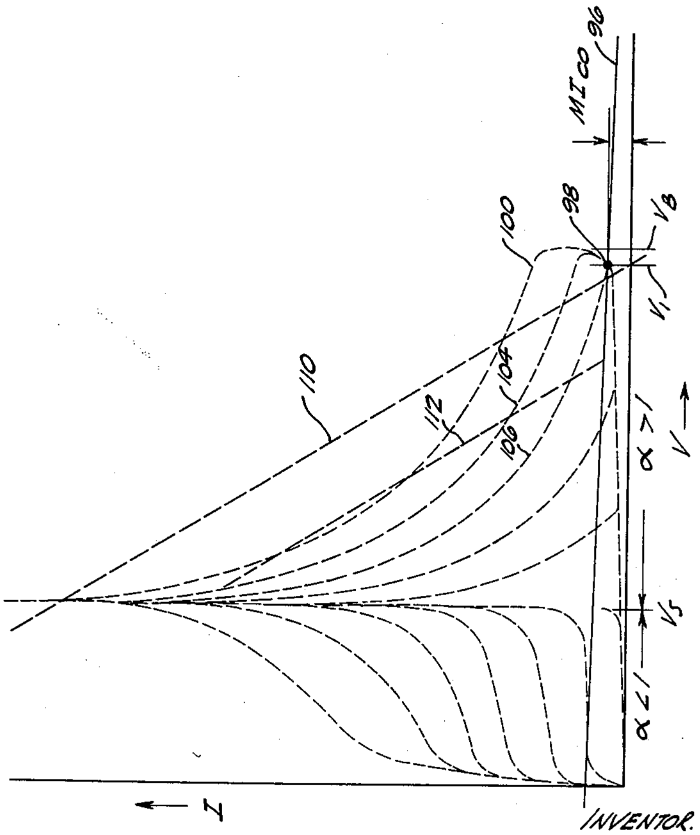
FIG. 2 is a graph of voltage versus current showing the operating characteristics of the avalanche transistors of FIG. 1.

Referring now to FIG. 2, the operating characteristics of the avalanche transistors utilized in the circuits in accordance with this invention will be further explained. For the arrangement of the transistors such as 20 which is essentially in a grounded emitter arrangement, the voltage V along the X-axis of the graph of FIG. 2 represents the photential maintained at the collector of the transistor 20 and the current I of the Y-axis represents the current flowing in the collector thereof. Because the transistor 20 is essentially grounded through diode $T_{11}$ when initiated into conduction, as will be explained subsequently, the avalanche operation may be explained with the grounded emitter characteristics of FIG. 2. As is well known, the operating characteristics of an avalanche transistor may include a first region where $\alpha$, which is the ratio of collector to emitter current, is less than 1 indicating that the current through the collector of the transistor is less than through the emitter. This first region is below a voltage $V_s$ at the collector of the transistor 20 which is the voltage at which the base current is internally compensated at the collector by an avalanche multiplication effect or current multiplication between the collector and the emitter so that $\alpha=1$. When the collector is biased to a higher potential than $V_s$, which is a second region of operation where $\alpha$ is greater than 1 avalanche multiplication causes more current to flow into the collector of the transistor than flows into the emitter up to a breakdown voltage $V_b$. At this breakdown voltage the multiplication of collector to emitter current in a n-p-n type transistor becomes essentially infinite. The operating region between the collector voltages $V_s$ and $V_b$, because of the avalanche multiplication effect, is a negative resistance region.

In the avalanche multiplication operation when the emitter to the base path of the n-p-n type transistor 20 is forward biased a predetermined amount, electrons or carriers travel from the emitter to the collector thereof. The collector to base junction is a high intensity field region because of the bias maintained between the collector and emitter, and in response to the electrons, produce hole electron pairs by collision with the atoms of the crystal lattice and are also ionized to produce additional electrons. The holes are then swept back to the base to emitter junction and on their way free more hole electron pairs to provide a regenerative feed-back action. Because of this avalanche multiplication, the current through the collector of the transistor 20 is substantially greater than through the emitter thereof.

It is to be noted that the above avalanche emitter operation in the transistor 20 is only initiated when the base to emitter junction is sufficiently forward biased so that electrons are able to travel into the base region. Thus, a standby condition is maintained in the transistor 20 when a voltage $V_1$ is applied to the collectors thereof and the base to emitter junction is forward biased a small amount. A load line 96 during the standby period has a relatively small slope because the resistor 44 has a relatively large value. A standby point 98 at the voltage $V_1$ is selected at the junction of the load line 96 and in the positive region of a characteristic negative resistance line 100. The voltage $V_1$ of the standby point 98 is selected slightly below the breakdown voltage $V_B$ so as to prevent steady state current $MI_{co}$, which is the avalanche multiplication factor times the steady state current, from becoming infinite. Also, the voltage $V_1$ is selected relatively close to the voltage $V_b$ so as to maintain a large potential difference between the collector and emitter and the transistor 20, which potential difference causes the area of accumulated electrons in the transistor to increase and the rate of hole electron pair production to increase when the base to emitter junction is forward biased. The bias voltage $V_1$ maintained at the collector of the transistor 20 is equal to the potential at the positive source of potential 46 minus the voltage drop caused by the steady state current $MI_{co}$ flowing through the resistor 44. Thus, the resistor 44 has a relatively large value so that the current $MI_{co}$ is maintained at a minimum amount to prevent excessive power dissipation.

Now that the standby operating point 98 has been determined, the pulse forming operation in the negative resistance region of the transistor 20 will be further explained. The potential $V_1$ at the collector of the transistor 20 is equal to the +200 volts at the source of potential 46 minus the voltage drop of the $MI_{co}$ current through the resistor 44. The bias developed by the voltage division of the resistors 22 and 27 at the base of the transistor 20 maintains the transistor at the standby point 98. Upon the application to the emitter of the transistor 20 of a trigger pulse of the waveform 13, the base to emitter junction of the transistor 12 is forward biased an increased amount so that electrons are allowed to pass into the base region to start the regenerative feedback action. The operating point of the transistor 20 after the avalanche breakdown and multiplication is initiated thus moves from the characteristic negative resistance curve 100 along the load-line 96 to a characteristic negative resistance curve such as 104. When the trigger pulse of the waveform 70 is removed from the base of the transistor 20, the operation may shift to another characteristic line such as 106. It is to be noted that the operation of the transistor 20 after avalanche multiplication is initiated is independent of the presence of the trigger pulses of the waveform 70. Essentially, a short circuit is present between the collector and emitter of the transistor 20 with the avalanche multiplication resulting from the high field strength at the base to collector junction thereof causing the current in the collector to be greater than the current in the emitter by the multiplication factor M. However, substantially all of the current that flows into the collector of the transistor 20 is obtained from the charge on the respective capacitors 36 and 42 which limit the current to prevent the transistors from being destroyed.

While the capacitors 36 and 42 discharge their stored charge through the transistor 12, the voltages at the lead 30 decrease to $V_s$ and may discharge to ground potential because of the stored carriers in the base region of the transistor. As the capacitors 36 and 42 discharge and the operation of the transistor 20 moves along a negative resistance line such as 106, transient load-lines similar to load-lines 110 and 112 are present in the negative resistance region with the lines generally moving to the left as the voltage on the collector decreases. When the voltage on the lead 30 is below $V_s$, the transistor 20 continues to conduct current because the transistor remains substantially forward biased between the base to emitter as a result of the internally stored carriers in that region. While the capacitors 36 and 42 are discharging current through the transistor 20, a pulse of the waveform 14 is developed across the load 18 as a result of current flowing through the lead 15 and a pulse is developed on the lead 74 similar to the waveform 14. Shortly after the current sources of the capacitors 42 and 46 are completely discharged, the transistor 20 recovers internally when free carriers in the base region are recombined so that the reverse biased base to emitter junctions prevent further conduction. Also at this time, the capacitors 36 and 42 start to charge by current flowing from the source of potential 46 until after a relatively long time interval, the voltage $V_1$ is again established on the leads 40 and 44 by the stored positive charges on the plates 34 and 40 of the capacitors 36 and 42. The sequential operation in accordance with this invention provides time for the capacitors 36 and 42 to be recharged to allow operation at a high pulse repetition frequency because for satisfactory operation, the transistor 20 must be returned to the standby point 98 before the pulsing operation is repeated.

Referring now to the waveforms of FIG. 3, as well as to the circuit of FIG. 1, the operation with tunnel diode logic to develop load pulses at a repetition rate substantially independent of the recovery time of the storage capacitors such as 36 and 42 will be further explained. It will be assumed for purposes of explanation that stage 1 has previously been set to the ready state as a result of stage *n* developing an output pulse of the waveform 14 in response to a trigger pulse of the waveform 13. In the ready state, the diode $T_{11}$ is at a low voltage ready state B as shown on a characteristic negative resistance curve 116 of a graph 120 where the X-axis indicates negative voltage $-V$ as a result of positive potential applied to the cathode of diode $T_{11}$ and the Y-axis indicates current flowing therethrough. The tunnel diode $T_{21}$ is at a high voltage state A as shown by a graph 122 so that the large negative voltage thereat maintains diode $T_{11}$ at the ready state B.

In all other stages such as stage 2 and stage *n* tunnel diodes $T_{12}$ and $T_{1n}$ are at normal low voltage state C and tunnel diodes $T_{22}$ and $T_{2n}$ are at a low voltage state B, which relatively small negative voltage maintains the diodes $T_{12}$ and $T_{1n}$ at the normal state C.

Upon the application of a negative trigger signal 124 of the waveform 13, the diode $T_{11}$ changes to a high voltage state A as a load line 123 rises above the peak of the curve 116. The large negative voltage across the diode $T_{11}$ at state A combined with the negative voltage of the pulse 124 cause the avalanche transistor 20 to be initiated into conduction so that current starts to flow from the capacitors 36 and 42 through the collector to emitter path thereof. It is to be noted that other transistors such as 20*a* and 20*b* at state C are not changed to state B because the negative voltage of the pulse 124 is not by itself sufficient to cause the diodes $T_{12}$ and $T_{1n}$ to exceed the peak voltage of their characteristic curves 116*a* and 116*b*. Because the capacitors 36 and 42 are effectively a source of potential, a positive potential is applied to the cathode of $T_{11}$ as current is conducted therethrough and diode $T_{11}$ automatically changes from state A to the low current state C. Also, as the avalanche transistor conducts current, through diode $T_{21}$, the positive potential applied to the cathode thereof changes diode $T_{21}$ to the low voltage state B for maintaining the diode $T_{11}$ at state C after termination of the conduction of the diode 20. Thus, stage 1 is returned to the normal state.

As the capacitor 48 discharges, an output pulse 128 of the waveform 14 is developed across the load 18 because current flows from ground through the load 18 to the negative plate 48 of the capacitor 36. As the control capacitor 42 simultaneously discharges through the collector to emitter path of the transistor 20, a negative pulse is also developed on the lead 74 and applied through the lead 84 to the cathode of the diode $T_{22}$. This negative potential developed between the cathode and anode of diode $T_{22}$ sets diode $T_{22}$ to state A and sets $T_{12}$ to the ready state B. The negative potential developed across the diode $T_{22}$ maintains the diode $T_{12}$ at the ready state B at the termination of the negative pulse on the lead 84. Thus, the tunnel diode logic of stage 2 is in the ready state and the tunnel diode logic of stage 1 has been returned to the normal state. It is to be noted that the width of the trigger pulses of the waveform 13 must be sufficiently narrow so as to be terminated before the diode $T_{21}$ is changed to state B or the stage 2 will be energized. However, utilizing conventional semiconductor techniques, the source 12 may develop pulses sufficiently narrow to be terminated during the inherent time delay before the diode $T_{11}$ is set to the ready state B.

It is to be emphasized that the automatic reset operation of diode $T_{11}$, for example, in accordance with this invention allows the transistor 20 to be triggered at the emitter while utilizing a minimum amount of power from the source 12. As discussed above, when the negative pulse is applied to the cathode of diode $T_{11}$ which is at the ready state B, diode $T_{11}$ is rapidly changed to the high voltage state A so that a relatively small current is passed therethrough to ground from the source 12. When the avalanche transistor 20 is initiated into conduction from the positive source of the capacitors 36 and 42, current passes in the reverse direction through diode $T_{11}$, and that diode is automatically reset to the state C. Thus, the transistor 20 conducts the major of the load current through a low impedance so that there is a mimimum power loss of the load current during formation of the pulse 128 of the waveform 14. Therefore, the diode $T_{11}$ has a high impedance state during triggering and automatically resets to a low impedance state after the transistor 20 is initiated into conduction. Although the diode $T_{21}$ causes diode $T_{11}$ to change to the ready state B so that only one stage fires at a time, the emitter trigger arrangement in accordance with this invention may be utilized when a fixed source of potential is provided instead of the diode $T_{21}$. For example, when triggering a single avalanche transistor, states A and C may be utilized as the two states of the diode $T_{11}$ providing the power saving advantages in accordance with this invention.

When the transistor 20 is initiated into conduction in response to the negative trigger signal 124, the capacitor 36, which in the normal state has a positive charge on the plate 40 and a negative charge on the plate 48, begins to rapidly discharge. As a result, a large pulse of current flows from ground through the load 18 to the plate 48 forming the output pulse 128 of the waveform 52. Because of the potential drop of the plate 48 of the capacitor 36 discharging through the transistor 20, the diode 52 is biased into a conductive state. Other diodes of the OR gate such as 52*a* and 52*b* are not rendered conductive as only the transistor 20 of state 1 has been triggered into conduction. Oscillations at the termination of the pulse 128 are substantially suppressed by the presence of the diode 19 across the load 18. It is to be noted that because of the arrangement of the storage capacitor 36, the circuit presents a low output impedance to the load 18.

It is to be again noted that only in the ready stage such as stage 1 the tunnel diode $_{11}$ in the ready state B responds to the low amplitude trigger pulses of the waveform 70. The operating point of diodes such as $T_{12}$ and $T_{1n}$ at the normal state C rises on the characteristic curve 116 in response to the negative potential of the pulse 124 of the waveform 70, but the negative potential of the pulse 124 is insufficient to change the diodes $T_{12}$ and $T_{1n}$ to state A.

Now after the completion of the above operation to form the load pulse 128 with stage 1 having been returned to the normal state and stage 2 changed to the ready state, a second trigger pulse 132 applied to the lead 10 triggers the avalanche transistor 20a and a similar operation as discussed above forms a pulse 134 as current flows through the load 18 and the diode 52a to the discharging capacitor 36a. Also, the diode $T_{12}$ is reset to the normal state C and the diode $T_{22}$ is changed to the normal state B. In response to the negative pulse developed by the discharge of capacitor 42a, diode $T_{2n}$ is set to the ready state A and diode $T_{1n}$ is set to the ready state B. Thus, upon the occurrence of a trigger pulse 138, transistor 20b of stage *n* is initiated into conduction and a load pulse 142 is formed as capacitor 36 discharges through the collector to emitter path of the transistor 20b. The diodes $T_{1n}$ and $T_{2n}$ are respectively reset to the normal states C and B and diodes $T_{11}$ and $T_{21}$ in response to a negative pulse on the lead 84b are respectively set to states B and A so that stage 1 is in the ready state.

Thus, upon the occurrence of a trigger pulse 144, stage 1 again forms a load pulse 146 and upon the occurrence of a trigger pulse 150, stage 2 forms a load pulse 152, each stage being sequentially fired in accordance with this invention. Because the time between firing any particular stage is multiplied by *n*, the number of stages utilized, recovery time is provided for the storage capacitors and the repetition frequency may be increased to *n* times the allowable frequency when utilizing a single stage. For example, while a single stage is limited to approximately 1 mc. repetition rate by the recovery time thereof, three stages as shown in FIG. 1 may operate at approximately a 3 mc. repetition rate. It is to be noted that with a plurality of stages repetition frequencies are only limited by the width of the pulse which may be approximately 5 milli-micro-seconds. The circuit in accordance with this invention is operable at pulse repetition frequencies up to 200 mc. by providing sufficient operating stages in accordance with the principles of this invention.

It is to be noted that the pulse forming circuit in accordance with this invention is not limited to n-p-n type transistors but p-n-p types may be utilized by reversing the polarities of the circuit in accordance with well known principles.

Thus, there has been described a simplified power driver utilizing avalanche transistor for developing relatively narrow pulses at a very high pulse reptition frequency. As a result of the utilization of tunnel diode logic, inductive elements are eliminated to provide a circuit that has a minimum weight and is highly applicable to printed circuit techniques. Because of the automatic reset operation of the tunnel diode coupled to the emitter of the avalanche transistor, a minimum power is utilized from the source of trigger pulses.

What is claimed is:

1. A pulse forming circuit comprising a source of trigger pulses, a load, a plurality of stages each including an avalanche transistor having a first and a second electrode and a base, biasing means coupled to the base of said transistor, first and second sources of potential, a current limiting resistor coupled between said first source of potential and the first electrode of said transistor, a first storage capacitor coupled between the first electrode and said load, a first tunnel diode coupled between the second electrode of said transistor and said second source of potential, said source of trigger pulses coupled to the second electrode of said transistor, a second tunnel diode coupled between the second electrode of said transistor and said second source of potential, biasing means coupled to the second electrode of said transistor, a second storage capacitor coupled from the first electrode of said transistor to said second tunnel diode, and means sequentially and continuously coupling said second storage capacitor of each stage to the second tunnel diode of the succeeding stage, whereby sequentially in each of said stages said first tunnel diode is set to a first potential state to respond to a trigger pulse to form a load pulse and then reset to a second potential state so as to be unresponsive to a trigger pulse.

2. A pulse forming circuit comprising a source of trigger pulses, a load, a plurality of pulse forming stages each including first, second and third sources of potential, an avalanche transistor having a base, an emitter and a collector, voltage divider means coupled between said first and second sources of potential and to said base, a current limiting resistor coupled between said third source of potential and said collector, a first charging capacitor having one plate coupled to said collector, a gating diode coupled between the other plate of said first charging capacitor and said load, means coupling said emitter to said source of trigger pulses, a first tunnel diode having a cathode and an anode coupled respectively between said emitter and said second source of potential, a first resistor having one end coupled to said emitter, a second tunnel diode having an anode and a cathode with the cathode coupled to the other end of said first resistor, a second resistor coupled between the anode of said second tunnel diode and said second source of potential, a second charging capacitor coupled between said collector and the anode of said second tunnel diode, a third resistor coupled between the cathode of said second tunnel diode and said first source of potential, and connecting means coupled between the anode of said second tunnel diode of one stage to the cathode of said second tunnel diode of the succeeding stage so as to sequentially and continually couple all of said plurality of stages.

3. A pulse forming circuit including a plurality of stages for responding to trigger pulses applied from a source to sequentially be rendered operative to apply a pulse through an OR gate to a load comprising in each stage a transistor having avalanche characteristics with a base, a collector and an emitter, first, second and third sources of potential, biasing means coupled to the first and second sources of potential and to the base of said transistor, a current limiting resistor coupled between said third source of potential and the collector of said transistor, first storage means coupled between the collector of said transistor and the OR gate, connecting means coupling the source of trigger pulses to the emitter of said transistor, a first tunnel diode coupled between the emitter of said transistor and said second source of potential, a first resistor having one end coupled to the emitter of said transistor, a second tunnel diode having a first and a second end with the first end coupled to the other end of said first resistor, a second resistor coupled between the second end of said second tunnel diode and said second source of potential, second storage means having a first end coupled to the collector of said transistor and a second end coupled to the second end of said second tunnel diode, a third resistor coupled between the first end of said second tunnel diode and said first source of potential, and means sequentially and continuously coupling the second end of said second tunnel diode in each stage to the first end of said second tunnel diode in the succeeding stage whereby each stage sequentially applies a pulse to said load in response to succeeding trigger pulses.

4. A circuit for applying pulses to a load at a high repetition rate in response to a source of trigger pulses comprising a plurality of pulse forming stages each including a transistor operating in the avalanche mode and having a base and a first and second electrode, biasing means coupled to said base, a source of power coupled to said first electrode, a first storage capacitor having a first plate coupled to the first electrode and a second plate coupled to the load, means coupling the second electrode to the source of trigger pulses, a source of reference potential, a first negative resistance device coupled between said emitter and said source of reference potential and having a low voltage state, an intermediate voltage state and a high voltage state, a second negative resistance device coupled between said emitter and said source of reference potential and having a low voltage state and a high voltage state, a second storage capacitor coupled between said first electrode and said second negative resistance device, and interconnecting means coupled between the second storage capacitor of each stage to the second negative resistance device of the succeeding stage so that all of said plurality of stages are continually and sequentially coupled, whereby only one of said stages is in a ready state with said first device at the intermediate voltage state and said second device at the high voltage state and all other stages are in the normal state with said first device at the low voltage state and the second device at the low voltage state, said stage at a ready state responding to a trigger pulse so that said first device changes to the high voltage state and in turn to the low voltage state and said second device changes to the low voltage state and in the succeeding stage said first device changes to the intermediate voltage state and said second device changes to the high voltage stage so that only a succeeding stage responds to each succeeding trigger pulse to apply a pulse to said load.

5. A logical element for controlling a current conductive device having a first terminal coupled to a first source of potential and having a second terminal, the device being responsive to an initiating signal applied to said second terminal to be initiated into conduction, the logical element responding to a pulse from a first source of pulses to be set from a normal state to a ready state and responding to a trigger pulse from a second source of pulses when in the ready state to provide the initiating signal to the second terminal, the logical circuit returning to the normal state after being initiated into conduction comprising second and third sources of potential, a first tunnel diode coupled between the second terminal of the device and the second source of potential, a first resistor having one end coupled to the second terminal of said device, a second tunnel diode having a first and a second end with the first end coupled both to the other end of said first resistor and to the first source of pulses, a second resistor coupled between the second end of said second tunnel diode and said second source of potential, storage means having a first end coupled to the first terminal of said device and a second end coupled to the second end of said second tunnel diode, a third resistor coupled between the first end of said second tunnel diode and said third source of potential and means coupling the second terminal of said device to said second source of pulses.

6. A circuit operable when set from a normal state to a ready state in response to a pulse from a first source to respond to a trigger pulse applied from a second source to develop a pulse across a load comprising a transistor having avalanche characteristics with a base, a collector and an emitter, first, second and third sources of potential, biasing means coupled to the first and second sources of potential and to the base of said transistor, a current limiting resistor coupled between said third source of potential and the collector of said transistor, first storage means coupled between the collector of said transistor and the load, first connecting means coupling the second source of pulses to the emitter of said transistor, a first tunnel diode coupled between the emitter of said transistor and said second source of potential, a first resistor having one end coupled to the emitter of said transistor, a second tunnel diode having a first and a second end with the first end coupled to the other end of said first resistor, a second resistor coupled between the second end of said second tunnel diode and said second source of potential, second storage means having a first end coupled to the collector of said transistor and a second end coupled to the second end of said second tunnel diode, a third resistor coupled between the first end of said second tunnel diode and said first source of potential, and second connecting means coupling the first source of pulses to the first end of said second tunnel diode, whereby when said first and second tunnel diodes are set in the ready state, the circuit responds to a trigger pulse to apply a pulse to said load and to be reset to the normal state.

References Cited in the file of this patent

UNITED STATES PATENTS

| | | |
|---|---|---|
| 2,594,336 | Mohr | Apr. 29, 1952 |
| 2,838,664 | Wolfendale | June 10, 1958 |
| 2,958,046 | Watters | Oct. 25, 1960 |

OTHER REFERENCES

1960 International Solid-State Circuits Conference, February 10, 1960 (first edition), "Esaki (Tunnel)-Diode Logic Circuits," Neff et al., pages 16, 17.